(12) United States Patent
Sugihara et al.

(10) Patent No.: US 9,530,957 B2
(45) Date of Patent: Dec. 27, 2016

(54) MAGNETIC SENSOR

(75) Inventors: Shinji Sugihara, Niigata-ken (JP);
Fumihito Koike, Niigata-ken (JP);
Yasushi Watanabe, Niigata-ken (JP);
Hideto Ando, Niigata-ken (JP)

(73) Assignee: ALPS ELECTRIC CO., LTD., Tokyo (JP)

(*) Notice: Subject to any disclaimer, the term of this patent is extended or adjusted under 35 U.S.C. 154(b) by 739 days.

(21) Appl. No.: 13/446,264

(22) Filed: Apr. 13, 2012

(65) Prior Publication Data

US 2012/0200292 A1 Aug. 9, 2012

Related U.S. Application Data

(63) Continuation of application No. PCT/JP2010/071546, filed on Dec. 2, 2010.

(30) Foreign Application Priority Data

Dec. 2, 2009 (JP) ................. 2009-274131

(51) Int. Cl.
*G01R 33/09* (2006.01)
*H01L 43/08* (2006.01)
(Continued)

(52) U.S. Cl.
CPC ............ *H01L 43/08* (2013.01); *B82Y 25/00* (2013.01); *G01R 33/0206* (2013.01); *G01R 33/093* (2013.01)

(58) Field of Classification Search
CPC ....... G01R 33/093; G01R 33/06; G01R 33/09; G01R 33/091; G01R 33/095; G01R 33/096; G01R 33/098; H01L 43/00; H01L 43/08
See application file for complete search history.

(56) References Cited

U.S. PATENT DOCUMENTS

2006/0290347 A1* 12/2006 LaClair et al. .......... 324/207.26
2009/0237074 A1* 9/2009 Kou et al. ..................... 324/247
(Continued)

FOREIGN PATENT DOCUMENTS

JP 9-129944 5/1997
JP 2003-149312 5/2003
(Continued)

OTHER PUBLICATIONS

Search Report dated Feb. 22, 2011 from International Application No. PCT/JP2010/071546.

*Primary Examiner* — David M. Schindler
(74) *Attorney, Agent, or Firm* — Beyer Law Group LLP

(57) ABSTRACT

A magnetic sensor includes magnetoresistive elements and a soft magnetic body. The magnetoresistive elements have multi layers including a magnetic layer and a nonmagnetic layer on a substrate, and exert a magnetoresistance effect. The soft magnetic body is electrically disconnected with the magnetoresistive elements, and converts a vertical magnetic field component from the outside into a magnetic field component in a horizontal direction so as to provide the magnetoresistive elements with the horizontally converted magnetic field component. The magnetoresistive elements have a pinned magnetic layer having a fixed magnetization direction and a free magnetic layer having a variable magnetization direction. The free magnetic layer is stacked on the pinned magnetic layer with a nonmagnetic layer interposed between the free magnetic layer and the pinned magnetic layer. The magnetization directions of the pinned magnetic layers of the magnetoresistive elements are the same direction. The magnetoresistive elements form a bridge circuit.

6 Claims, 9 Drawing Sheets

(51) Int. Cl.
 *B82Y 25/00* (2011.01)
 *G01R 33/02* (2006.01)

(56) References Cited

U.S. PATENT DOCUMENTS

| | | | |
|---|---|---|---|
| 2009/0284254 A1 | 11/2009 | Kasajima | |
| 2010/0156405 A1 | 6/2010 | Furukawa et al. | |
| 2010/0253330 A1* | 10/2010 | Sasaki et al. | 324/252 |
| 2011/0074406 A1* | 3/2011 | Mather et al. | 324/252 |
| 2011/0089941 A1* | 4/2011 | Sasaki | 324/252 |

FOREIGN PATENT DOCUMENTS

| | | |
|---|---|---|
| JP | 2004-61380 | 2/2004 |
| JP | 2005-201775 | 7/2005 |

\* cited by examiner

STRONG ↑ WEAK

MAGNETIC SENSOR

CLAIM OF PRIORITY

This application is a Continuation of International Application No. PCT/JP2010/071546 filed on Dec. 2, 2010, which claims benefit of Japanese Patent Application No. 2009-274131 filed on Dec. 2, 2009. The entire contents of each application noted above are hereby incorporated by reference.

BACKGROUND OF THE INVENTION

1. Field of the Invention

The present invention relates to a magnetic sensor that employs magnetoresistive elements and that is capable of detecting a vertical magnetic field component.

2. Description of the Related Art

Magnetic sensors employing magnetoresistive elements may be used as, for example, a geomagnetic sensor that detects the earth's magnetic field and is incorporated into a portable device such as a mobile phone.

A geomagnetic sensor is configured to detect each of magnetic field components in the X-axis direction and the Y-axis direction, which are orthogonal to each other in a horizontal plane, and the vertical direction (Z-axis direction) which is orthogonal to the horizontal plane.

For example, in the patent documents Japanese Unexamined Patent Application Publication No. 2003-149312 and No. 2004-61380, a magnetic sensor employing Hall elements is disclosed. In the above patent documents, a configuration of the magnetic sensor is disclosed in which ferrite chips are disposed on the tops of multiple Hall elements and ferrite substrates are disposed on the bottoms of the Hall elements, and in which a magnetic body that extends in the horizontal direction connects the ferrite chips to each other.

It is described that a vertical magnetic field component passes through the Hall elements via the ferrite chips and the ferrite substrates and that a horizontal magnetic field component is oriented in the vertical direction at both ends of the magnetic body and passes through the Hall elements via the ferrite chips and the ferrite substrates (for example, see the paragraphs [0021] and [0022] in Japanese Unexamined Patent Application Publication No. 2003-149312).

In these patent documents, a horizontal magnetic field component may be detected using Hall elements that detect a magnetic field component in the vertical direction with respect to the substrate surface.

However, a magnetic sensor employing Hall elements has a disadvantage that since the magnetic sensor uses ferrite chips, ferrite substrates, and a magnetic body as described in the patent documents, the magnetic sensor has a complicated configuration and uses a large number of parts. Another disadvantage is that the magnetic body which connects the ferrite chips to each other extends a long way in the horizontal direction, so that the size of the magnetic sensor in plan view is larger than that of a typical magnetic sensor and a small-size magnetic sensor may not be achieved. In addition, the Hall elements are required to be disposed separately from each other at both end positions of the magnetic body, causing another disadvantage that a range of choices for installation is narrow, in addition to the above-described disadvantage that a small-size magnetic sensor may not be achieved. Thus, a configuration of a magnetic sensor that detects vertical and horizontal magnetic field components by employing Hall elements fails to improve the production efficiency effectively.

Instead of the magnetic sensor employing Hall elements as described above, a magnetic sensor employing magnetoresistive elements (MR elements) that exert a magnetoresistance effect (MR effect) is capable of detecting a horizontal magnetic field component that is parallel to a substrate surface, but is not capable of detecting a magnetic field component in the vertical direction with respect to the substrate surface. Conceivable ways to make a magnetoresistive element detect a vertical magnetic field component include a way in which the magnetoresistive element is vertically oriented (i.e., the substrate surface on which the magnetoresistive element is formed is oriented in the vertical direction), and a way in which the magnetoresistive element is formed on an inclined surface that is provided on the substrate surface and that is inclined from the horizontal direction toward the height direction.

However, a magnetic sensor employing any of the above-described configurations has a disadvantage that this magnetic sensor may not be manufactured at a low cost, and that non-uniformity of the products is likely to occur and a stable characteristic of magnetic detection fails to be obtained.

The present invention is made to overcome the above-described disadvantages of the related art, and in particular provides a magnetic sensor that employs magnetoresistive elements and that is capable of detecting a vertical magnetic field component easily and properly.

SUMMARY OF THE INVENTION

A magnetic sensor according to an aspect of the present invention includes multiple magnetoresistive elements and a soft magnetic body. The magnetoresistive elements each have multi layers including a magnetic layer and a nonmagnetic layer on a substrate, and exert a magnetoresistance effect. The soft magnetic body is electrically disconnected with the magnetoresistive elements, and converts a vertical magnetic field component from the outside into a magnetic field component in a horizontal direction so as to provide the magnetoresistive elements with the horizontally converted magnetic field component.

In addition, the magnetoresistive elements each have a pinned magnetic layer having a fixed magnetization direction and a free magnetic layer having a variable magnetization direction. The free magnetic layer is stacked on the pinned magnetic layer with a nonmagnetic layer interposed between the free magnetic layer and the pinned magnetic layer. The magnetization directions of the pinned magnetic layers of the magnetoresistive elements are the same direction. The magnetoresistive elements form a bridge circuit.

According to the aspect of the present invention, by using a simple configuration, a magnetic sensor that employs magnetoresistive elements and that is capable of detecting a vertical magnetic field component can be manufactured. In addition, the magnetic sensor can be manufactured at a low cost, and a small-size magnetic sensor can be also achieved.

In addition, a full-bridge circuit may be formed by the magnetoresistive elements. Since all of the fixed magnetization directions of the pinned magnetic layers of the magnetoresistive elements may be set to the same direction, the magnetoresistive elements can be easily and properly formed on the same substrate. The magnetoresistive elements may exhibit the same change in resistance for a horizontal magnetic field component from the outside, allowing the appearance of an output from the bridge circuit, which is caused by the horizontal magnetic field component, to be prevented. For a vertical magnetic field component, as described above, since the magnetic field component that is horizontally converted by the soft magnetic body flows in a direction into a magnetoresistive element disposed on the left side of the soft magnetic body and flows in a different direction into a magnetoresistive element disposed on the right side of the soft magnetic body, the resistance values of the left-side and right-side magnetoresistive elements are different. Accordingly, for example, left-side magnetoresistive elements are connected between an input terminal and a first output terminal and between a second output terminal and a ground terminal, and right-side magnetoresistive elements are connected between the input terminal and the second output terminal and between the first output terminal and the ground terminal, whereby different outputs can be obtained from the first and second output terminals, enabling the vertical magnetic field component to be properly detected.

It is preferable that each of the magnetoresistive elements be disposed near an end portion of an undersurface of the soft magnetic body.

Accordingly, the horizontally converted magnetic field component that has strong magnetic field strength may flow in the magnetoresistive elements, thereby allowing the sensor output to become large and allowing the vertical magnetic field component to be more effectively detected.

It is preferable that the magnetoresistive elements be disposed near end portions on both sides of the undersurface of the soft magnetic body. Accordingly, even when the magnetoresistive elements located on both sides of the soft magnetic body detect a horizontal magnetic field component from the outside (which is the external magnetic field that flows from the outside of the magnetic sensor in the direction orthogonal to the vertical magnetic field component), the magnetoresistive elements exhibit the same change in resistance, thereby allowing the output to be controlled so as not to appear (i.e., allowing the horizontal magnetic field component not to be detected). In contrast, the vertical magnetic field component is converted into a magnetic field component in the horizontal direction by using the soft magnetic body. The horizontally converted magnetic field component flows in a direction into the magnetoresistive element disposed on one side of the soft magnetic body and flows in the opposite direction into the magnetoresistive element disposed on the other side of the soft magnetic body. Thus, different changes in resistance occur in the magnetoresistive elements due to the action of the horizontally converted magnetic field component. A differential output is obtained from the magnetoresistive elements, enabling the vertical magnetic field component to be detected with higher precision.

It is preferable that when one of two directions that are orthogonal to each other in plan view is defined as a front-back direction and the other direction is defined as a right-left direction, the soft magnetic body be formed so as to extend in the front-back direction, each of the magnetoresistive elements be formed so as to be shorter than the soft magnetic body, and the magnetoresistive elements be disposed on both sides of the soft magnetic body in the right-left direction. Accordingly, multiple magnetoresistive elements can be disposed for one soft magnetic body, allowing a small-size magnetic sensor to be achieved. In addition, a wide range of choices is given for the arrangement of the magnetoresistive elements. For example, the magnetoresistive elements, which are arranged in the right-left direction, may be arranged so as to be opposite each other in the right-left direction or may be arranged so as to be shifted in the front-back direction with respect to each other.

It is preferable that multiple soft magnetic bodies be disposed with a space therebetween, and that, in plan view, a magnetoresistive element that is located in the space among the plurality of magnetoresistive elements is formed so as to be closer to either of adjacent soft magnetic bodies among the soft magnetic bodies with respect to a center of the space. Accordingly, for the magnetoresistive element, the horizontally converted magnetic field component (first magnetic field component) is properly supplied from the soft magnetic body located close to the magnetoresistive element, whereas the influence of the magnetic field component (second magnetic field component) that is antiparallel to the first magnetic field component and that is produced by the soft magnetic body located far from the magnetoresistive element can be made small. The situation in which the first magnetic field component supplied to the magnetoresistive element is canceled or extremely reduced by the second magnetic field component can be suppressed, enabling the vertical magnetic field component to be properly detected.

It is preferable that when one of two directions that are orthogonal to each other in plan view is defined as a front-back direction and the other direction is defined as a right-left direction, first soft magnetic bodies be disposed with a space therebetween in the right-left direction, each of the first soft magnetic bodies be formed so as to extend in the front-back direction, and second soft magnetic bodies are formed on both sides of each of the first soft magnetic bodies in the front-back direction so as to be parallel to each other in the right-left direction.

According to the above description, since horizontal magnetic field components in the two directions orthogonal to each other are properly absorbed, an influence of the horizontal magnetic field components from the outside on the magnetoresistive elements can be more effectively made small. Accordingly, the sensitivity of the magnetoresistive elements to the horizontal magnetic field components can appear to be more effectively reduced. This enables the sensitivity to the vertical magnetic field component to be relatively improved, enabling the vertical magnetic field component to be detected with higher precision.

It is preferable that the magnetoresistive elements be formed on the substrate, an insulating layer be formed from the top of the magnetoresistive elements onto the substrate, and the soft magnetic body be formed on the insulating layer. Consequently, the magnetoresistive elements and the soft magnetic body can be easily and properly formed. In addition, the magnetoresistive elements can be properly arranged near an end portion of the undersurface of the soft magnetic body, and the horizontally converted magnetic field component can be properly supplied to the magnetoresistive elements from the soft magnetic body.

DESCRIPTION OF THE PREFERRED EMBODIMENTS

Figure 1:
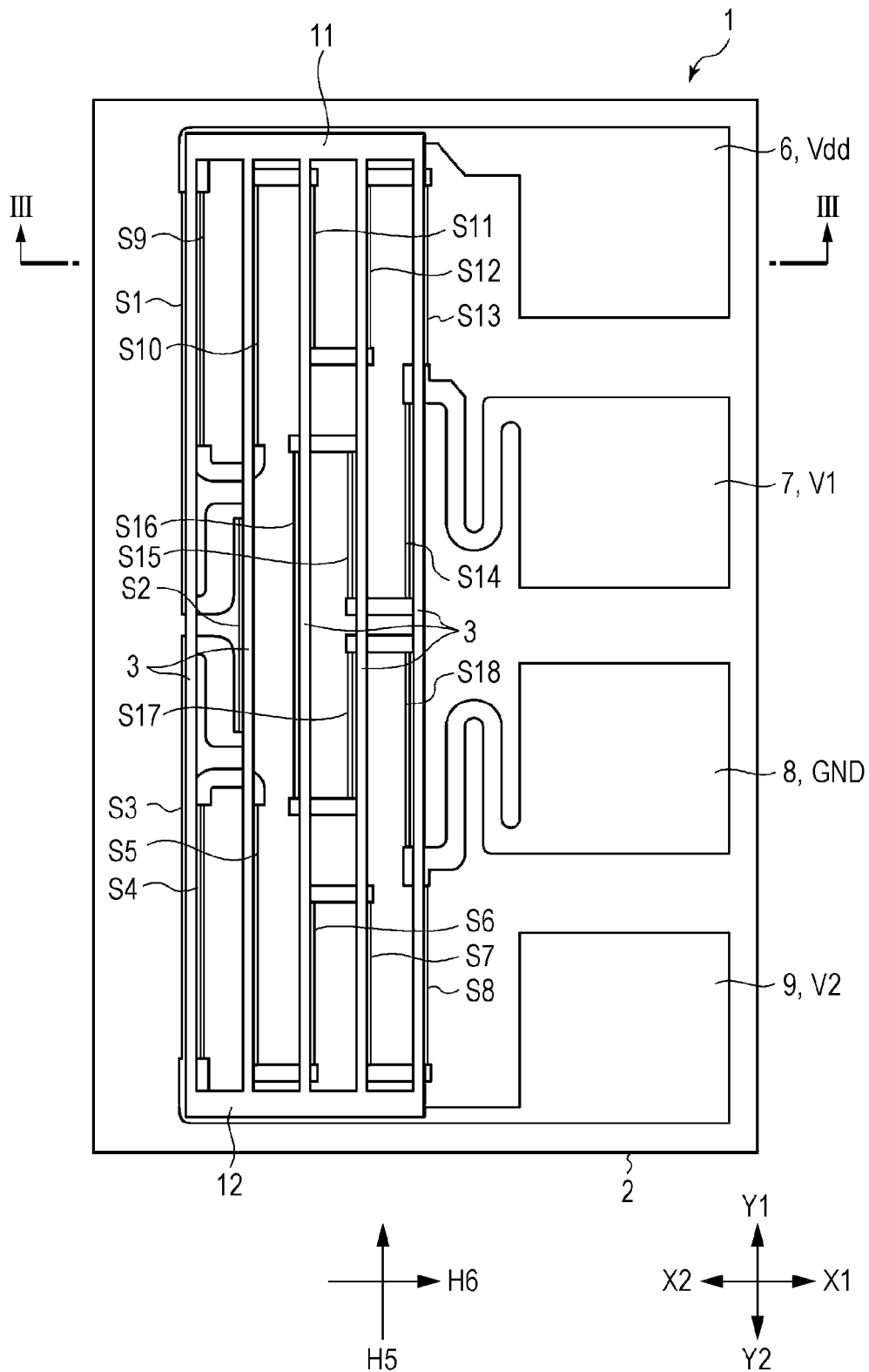
FIG. 1 is a plan view of a Z-axis magnetic sensor according to an embodiment of the present invention.
Figure 2:
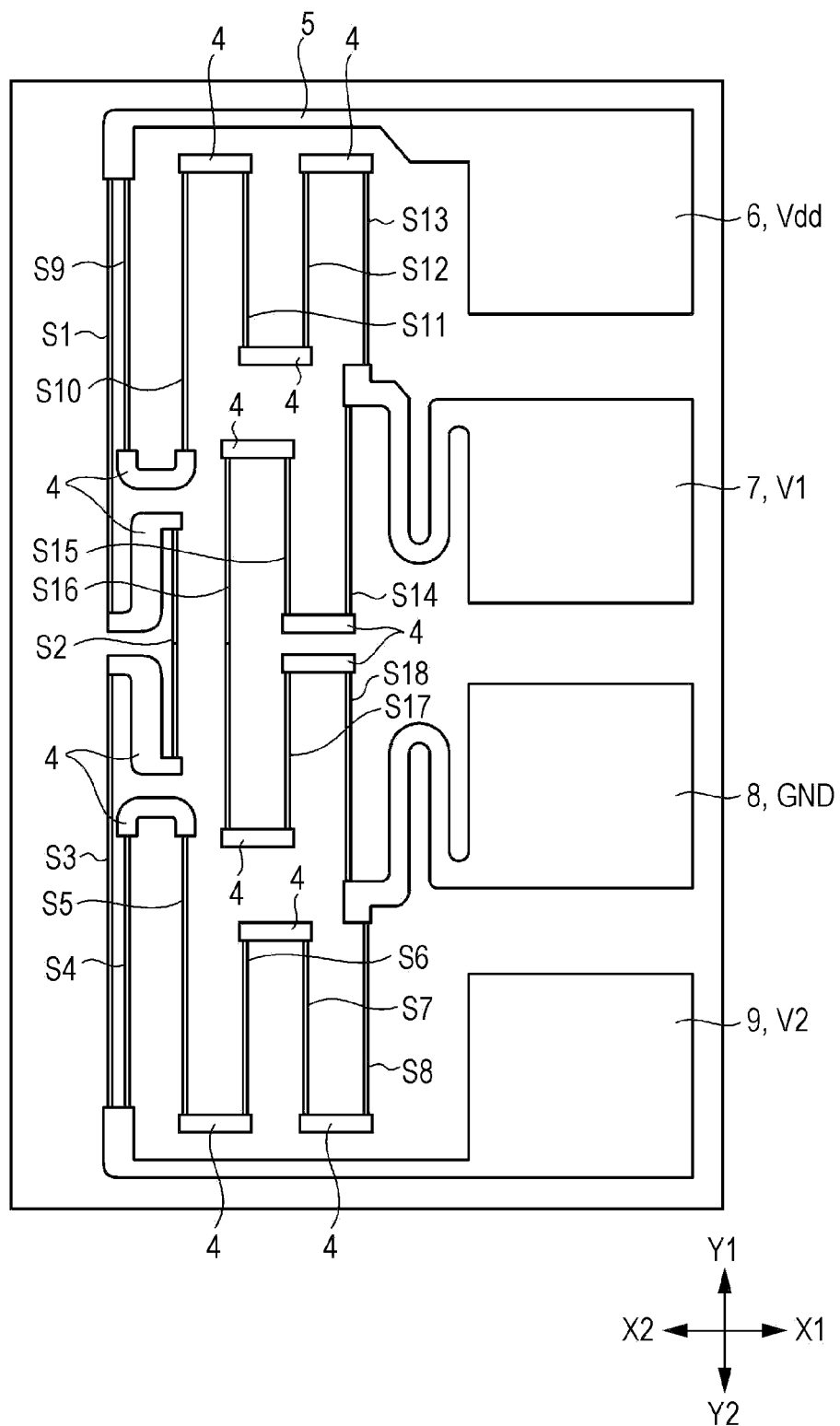
FIG. 2 is a plan view of the Z-axis magnetic sensor illustrated in FIG. 1, from which first soft magnetic bodies and second soft magnetic bodies are removed.
Figure 3:
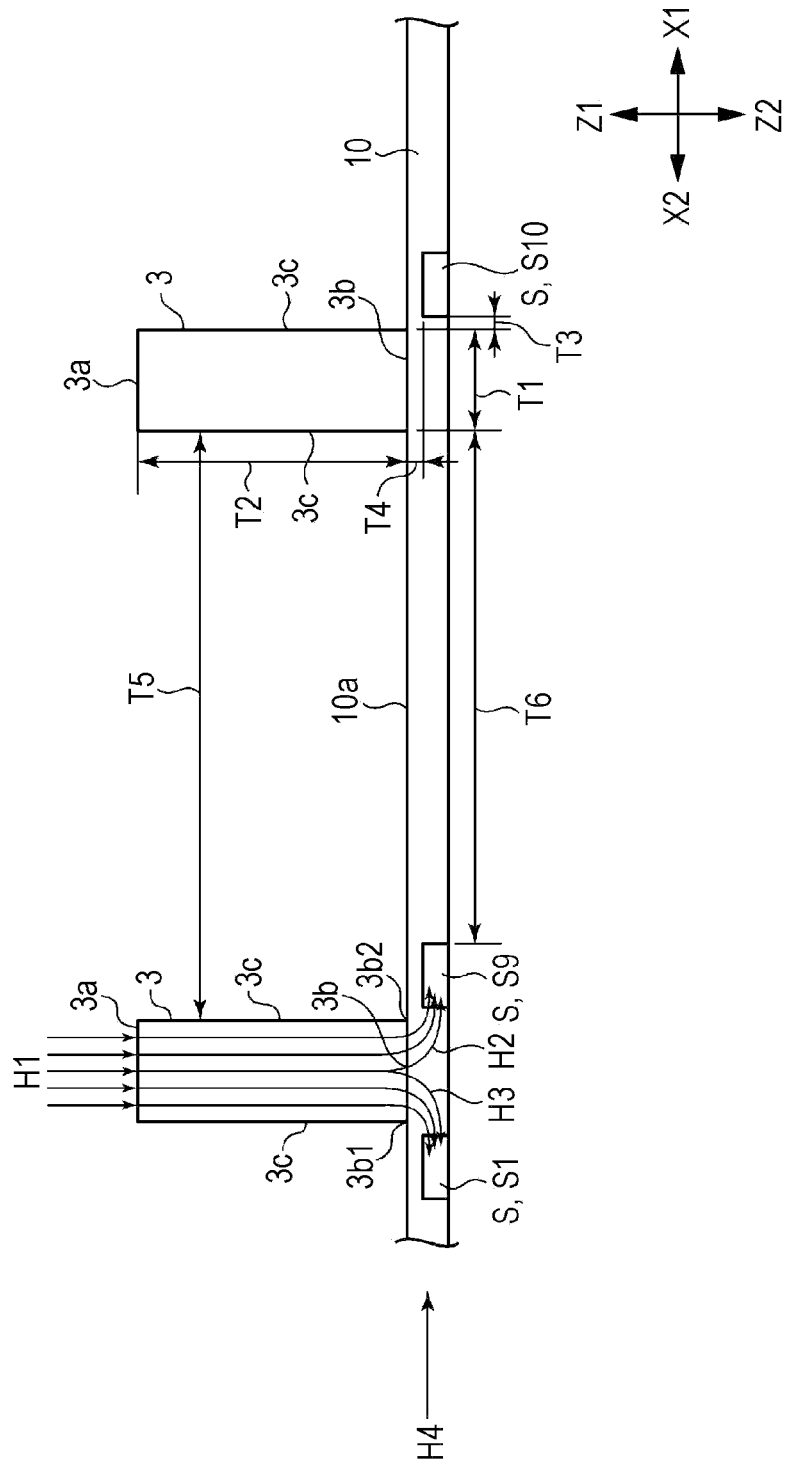
FIG. 3 is an enlarged partial vertical sectional view of the Z-axis magnetic sensor, taken along line III-III in the height direction and viewed in the direction of the arrows in FIG. 1.
Figure 4:
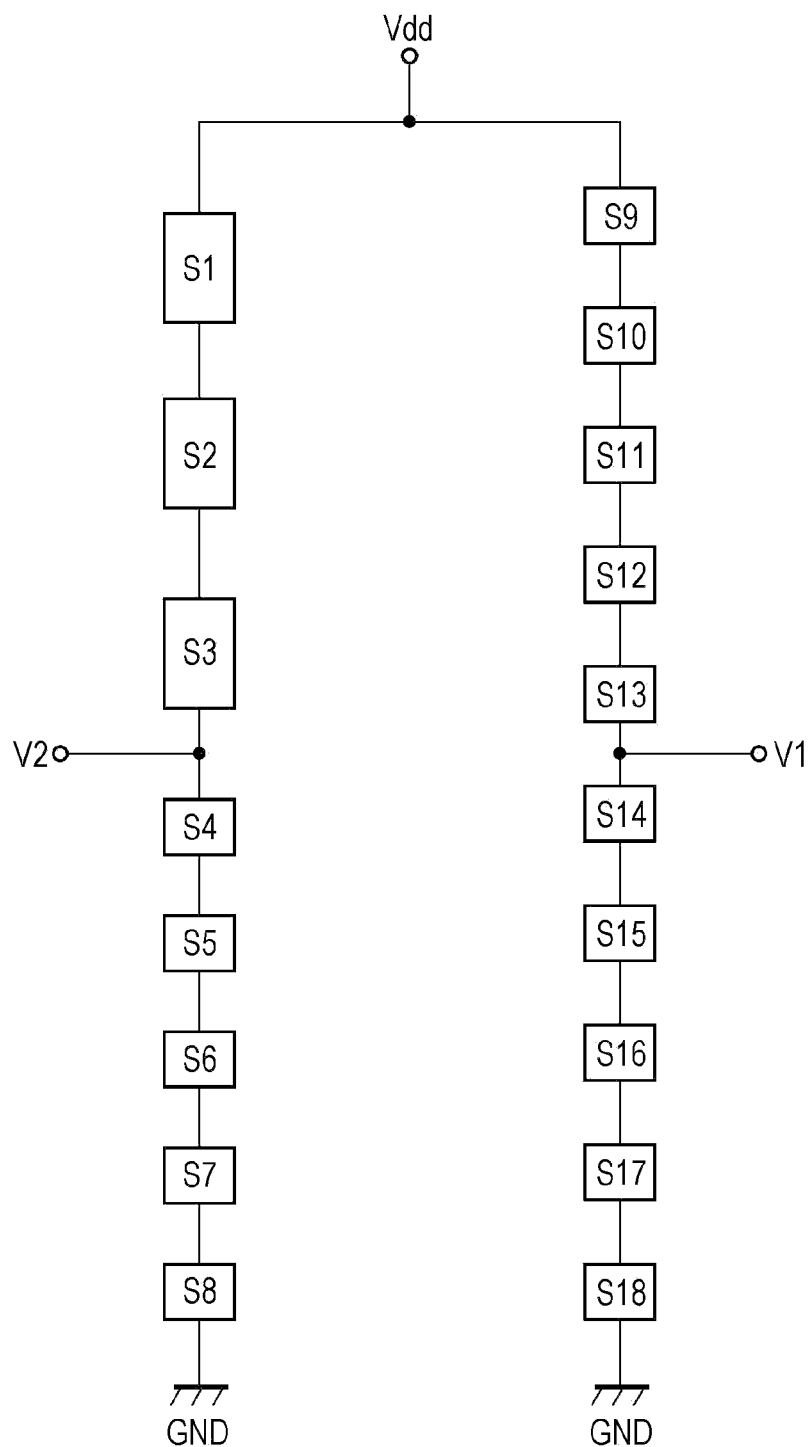
FIG. 4 is a circuit diagram of the Z-axis magnetic sensor according to the embodiment of the present invention.
Figure 5:
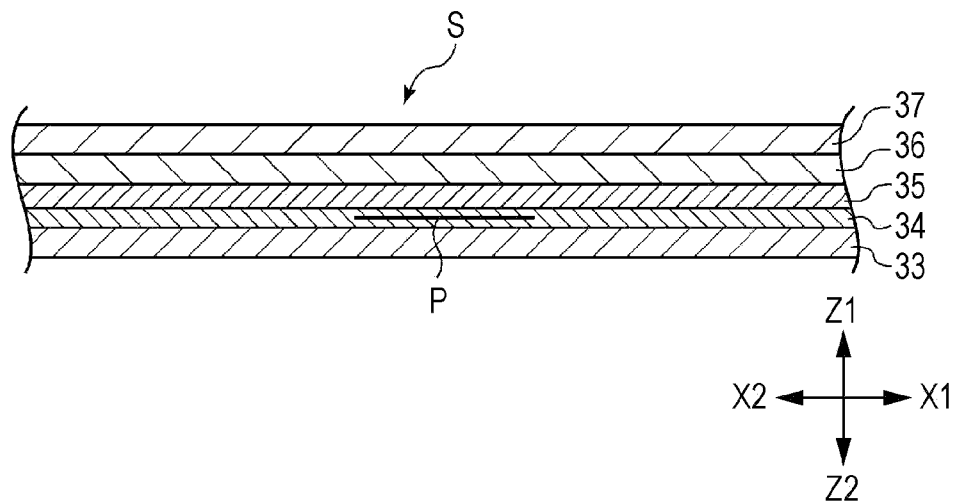
FIG. 5 is a partial vertical sectional view of a magnetoresistive element according to the embodiment of the present invention.
Figure 6A:
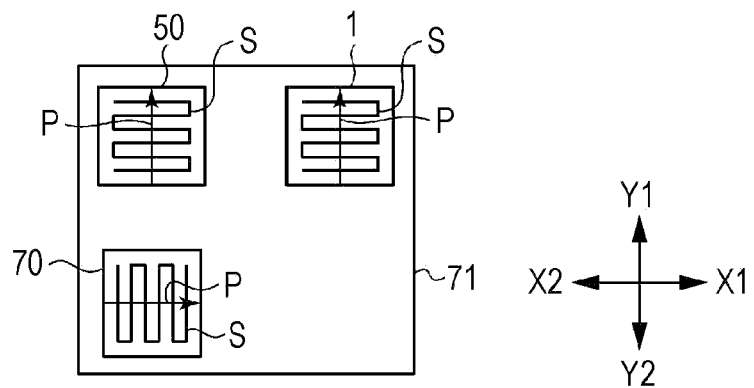
FIGS. 6A and 6B are schematic diagrams (plan views) illustrating geomagnetic sensors each including a Z-axis magnetic sensor, an X-axis magnetic sensor, and a Y-axis magnetic sensor.
Figure 6B:
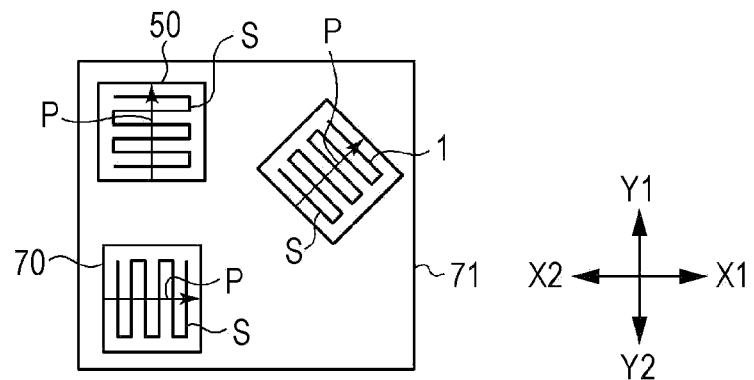
Figure 7:
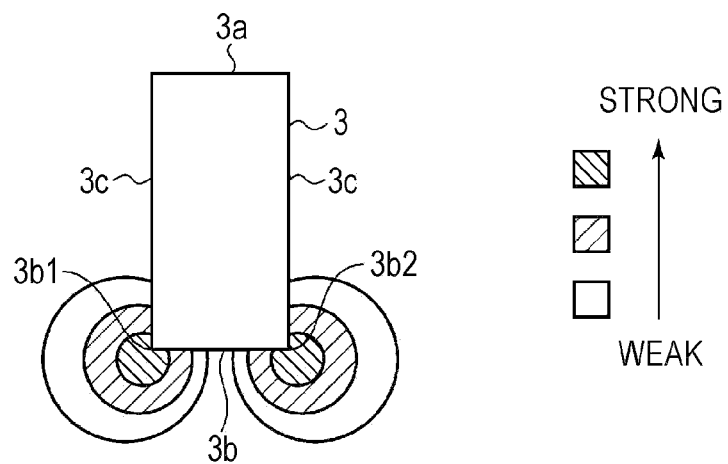
FIG. 7 is a diagram illustrating strength of a magnetic field emitted from a soft magnetic body according to the embodiment of the present invention.
Figure 8:
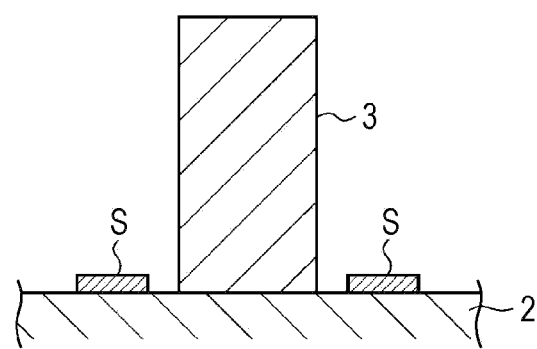
FIG. 8 is a partial vertical sectional view illustrating an arrangement of a soft magnetic body and magnetoresistive elements according another embodiment of the present invention.
Figure 9:
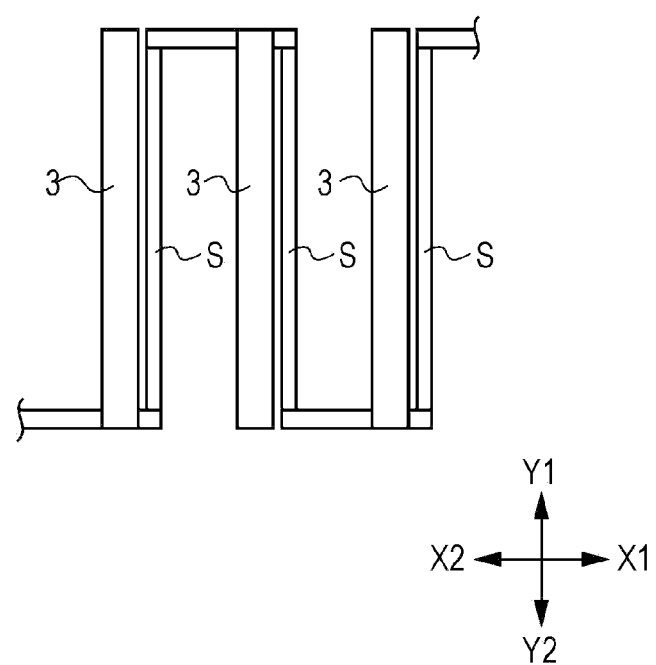
FIG. 9 is a partial plan view illustrating soft magnetic bodies and magnetoresistive elements according to yet another embodiment of the present invention.
Figure 10A:
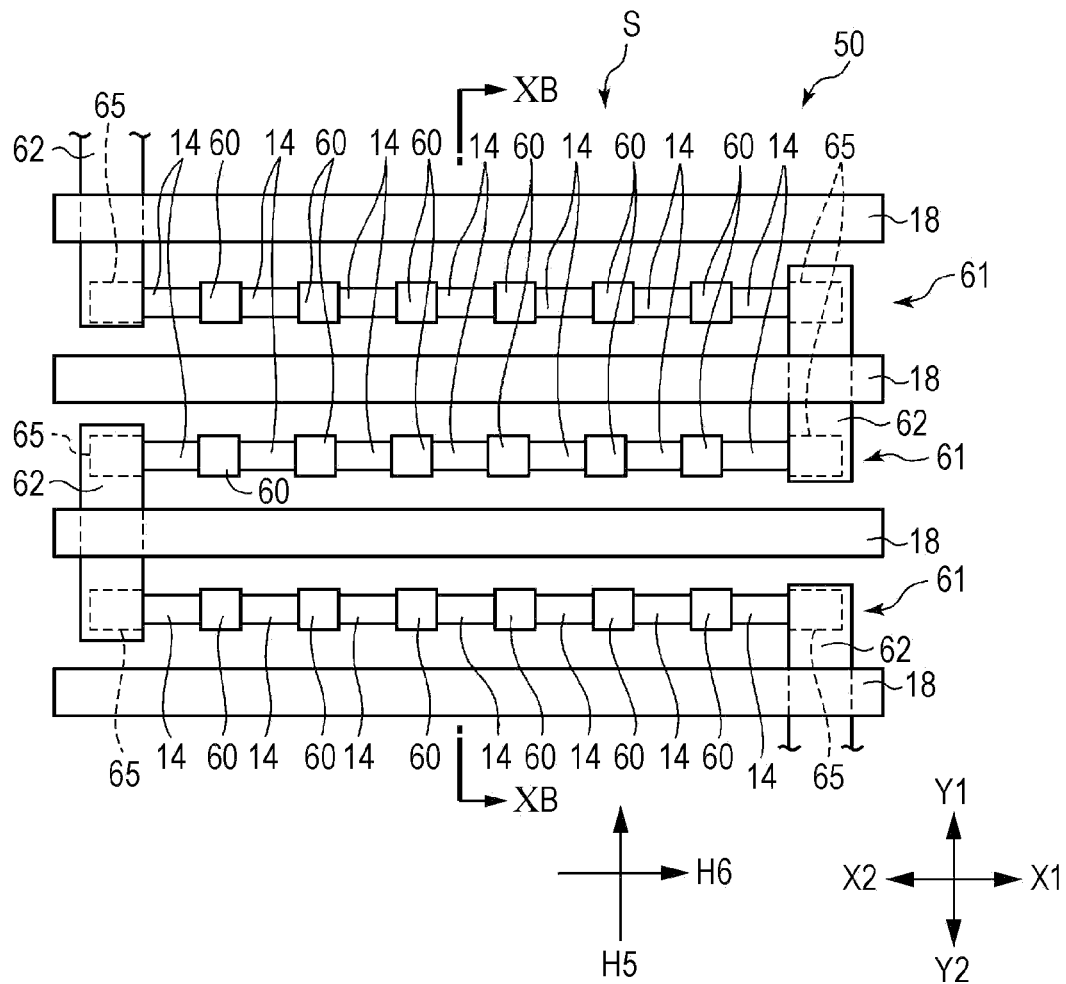
FIG. 10A is a partial plan view of a Y-axis magnetic sensor.
Figure 10B:
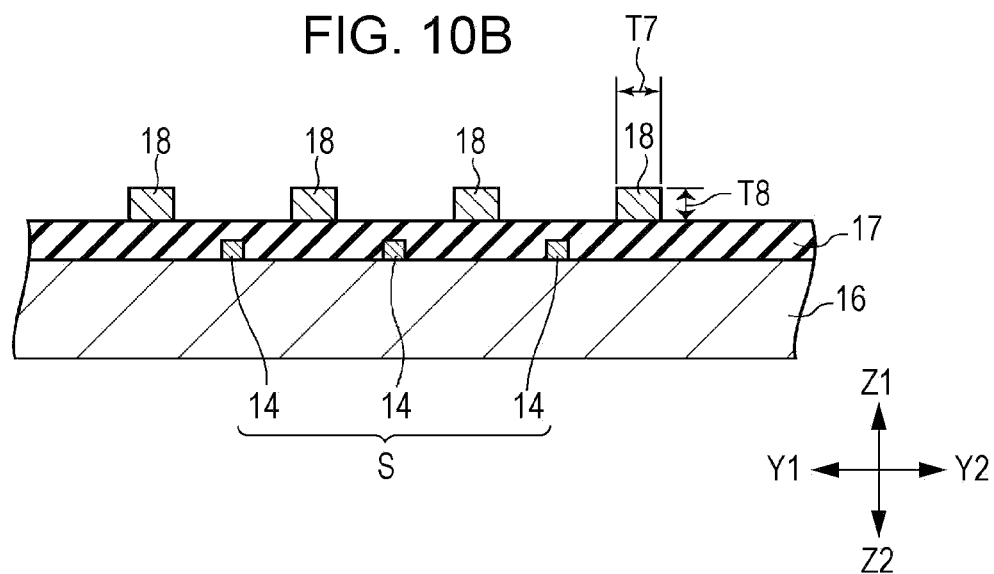
FIG. 10B is a partial vertical sectional view of the Y-axis magnetic sensor illustrated in FIG. 10A, taken along line XB-XB in the height direction and viewed in the direction of the arrows.
Figure 11:
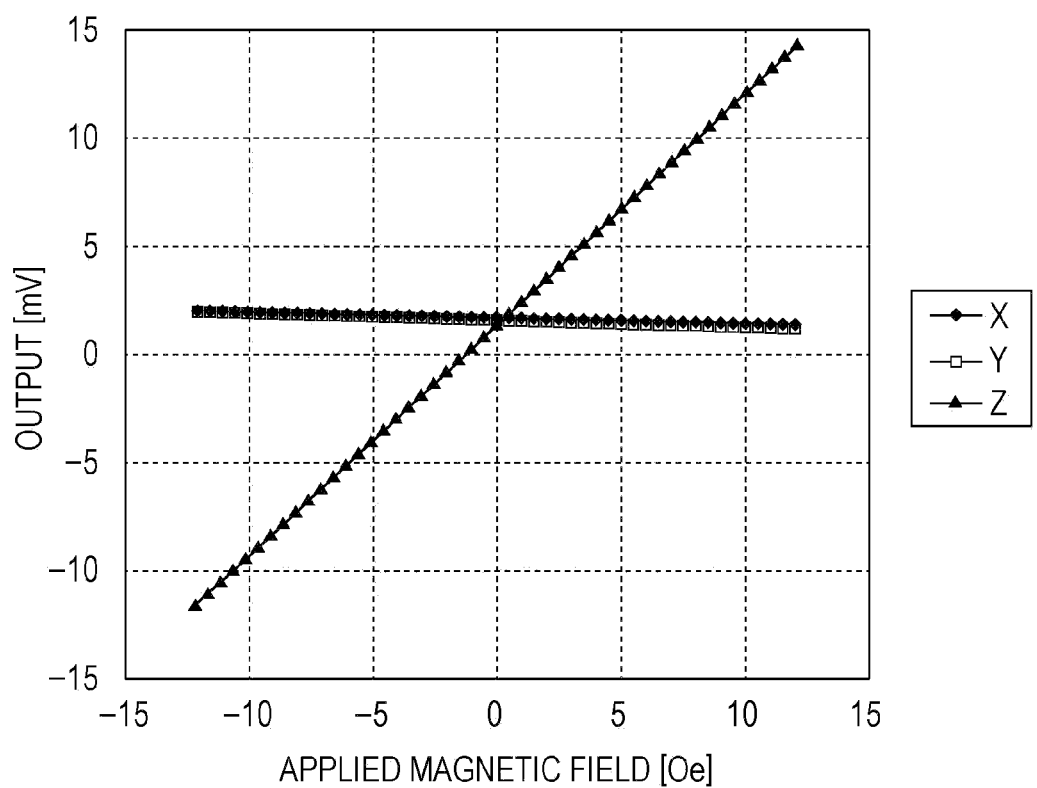
FIG. 11 is a graph showing relationship between an applied magnetic field and outputs which is obtained when a Z-axis magnetic sensor according to the embodiment is used.

FIG. 1 is a plan view of a Z-axis magnetic sensor according to an embodiment of the present invention. FIG. 2 is a plan view of the Z-axis magnetic sensor illustrated in FIG. 1, from which first soft magnetic bodies and second soft magnetic bodies are removed. FIG. 3 is an enlarged partial vertical sectional view of the Z-axis magnetic sensor, taken along line III-III in the height direction and viewed in the direction of the arrows in FIG. 1. FIG. 4 is a circuit diagram of the Z-axis magnetic sensor according to the embodiment of the present invention. FIG. 5 is a partial vertical sectional view of a magnetoresistive element according to the embodiment of the present invention. FIGS. 6A and 6B are schematic diagrams (plan views) illustrating geomagnetic sensors each including a Z-axis magnetic sensor, an X-axis magnetic sensor, and a Y-axis magnetic sensor. FIG. 7 is a diagram illustrating strength of a magnetic field emitted from a soft magnetic body according to the embodiment of the present invention. FIG. 8 is a partial vertical sectional view illustrating an arrangement of a soft magnetic body and magnetoresistive elements according another embodiment of the present invention. FIG. 9 is a partial plan view illustrating soft magnetic bodies and magnetoresistive elements according to yet another embodiment of the present invention. FIG. 10A is a partial plan view of a Y-axis magnetic sensor. FIG. 10B is a partial vertical sectional view of the Y-axis magnetic sensor illustrated in FIG. 10A, taken along line XB-XB in the height direction and viewed in the direction of the arrows. FIG. 11 is a graph showing relationship between an applied magnetic field and outputs which is obtained when a Z-axis magnetic sensor according to the embodiment is used.

A Z-axis magnetic sensor 1 including magnetoresistive elements according to the embodiment constitutes, for example, a geomagnetic sensor installed in a portable device such as a mobile phone.

The X-axis direction and the Y-axis direction illustrated in the diagrams represent two directions orthogonal to each other in a horizontal plane, and the Z-axis direction represents a direction orthogonal to the horizontal plane. The Y1-Y2 direction represents a "front-back direction"; the Y1 direction represents a direction toward the front, and the Y2 direction represents a direction toward the back. The X1-X2 direction represents a "right-left direction"; the X1 direction represents a direction toward the right, and the X2 direction represents a direction toward the left.

The Z-axis magnetic sensor 1 includes magnetoresistive elements S and first soft magnetic bodies 3 that are formed on a substrate 2, as illustrated in FIGS. 1 and 3.

As illustrated in FIG. 3, the multiple magnetoresistive elements S are formed through an insulating layer (not illustrated) on the substrate 2 which is composed of, for example, silicon.

As illustrated in FIG. 5, each magnetoresistive element S, which is a giant magnetoresistive (GMR) element, has a multilayer structure in which, for example, an antiferromagnetic layer 33, a pinned magnetic layer 34, a nonmagnetic layer 35, and a free magnetic layer 36 are formed and stacked on top of one another in this sequence from the bottom, and in which a protective layer 37 overlies the free magnetic layer 36. The magnetoresistive element S is formed by, for example, sputtering.

The antiferromagnetic layer 33 is composed of an antiferromagnetic material such as an iridium-manganese alloy (IrMn alloy). The pinned magnetic layer 34 is composed of a soft magnetic material such as a cobalt-iron alloy (CoFe alloy). The pinned magnetic layer 34 is preferably formed in a synthetic ferrimagnetic structure. The nonmagnetic layer 35 is composed of, for example, copper (Cu). The free magnetic layer 36 is composed of a soft magnetic material such as a nickel-iron alloy (NiFe alloy). The protective layer 37 is composed of, for example, tantalum (Ta). The multilayer structure of the magnetoresistive element S illustrated in FIG. 5 is an example, and other multilayer structures may be employed.

In the magnetoresistive element S, the antiferromagnetic coupling between the antiferromagnetic layer 33 and the pinned magnetic layer 34 causes the magnetization direction (P direction) of the pinned magnetic layer 34 to be fixed. According to the embodiment, the magnetoresistive element S extends in the front-back direction (Y1-Y2) as described below, and the pinned magnetization direction (P direction) of the pinned magnetic layer 34 is oriented in, for example, the right direction (X1) as illustrated in FIG. 5. In contrast, a magnetization direction of the free magnetic layer 36 changes in accordance with the external magnetic field. In a state where no magnetic field components are present, i.e., a state where the external magnetic field does not act, the magnetization direction of the free magnetic layer 36 is oriented in the front-back direction (Y1-Y2) due to the shape magnetic anisotropy of the free magnetic layer 36.

When the external magnetic field acts in the same direction as the pinned magnetization direction (P direction) of the pinned magnetic layer 34 so as to cause the magnetization direction of the free magnetic layer 36 to be changed to the external magnetic field direction, the magnetization direction of the free magnetic layer 36 comes to be parallel to the pinned magnetization direction of the pinned magnetic layer 34, resulting in a decrease in the electric resistance value of the magnetoresistive element S.

In contrast, when the external magnetic field acts in the direction opposite to the pinned magnetization direction (P direction) of the pinned magnetic layer 34 so as to cause the magnetization direction of the free magnetic layer 36 to be changed to the external magnetic field direction, the magnetization direction of the free magnetic layer 36 comes to be antiparallel to the pinned magnetization direction of the pinned magnetic layer 34, resulting in an increase in the electric resistance value of the magnetoresistive element S. Other than a GMR element, the magnetoresistive elements S may be formed by employing a tunneling magnetoresistive element (TMR element) in which the nonmagnetic layer 35 is formed of an insulating layer.

As illustrated in FIGS. 1 and 2, multiple magnetoresistive elements S1 to S18 are formed on the substrate 2. As illustrated in FIGS. 1 and 2, each of the magnetoresistive elements S1 to S18 extends a long way in the front-back direction (Y1-Y2) compared with the width dimension in the right-left direction (X1-X2). The magnetoresistive elements S1 to S18 have different length dimensions in the front-back direction (Y1-Y2). This is because the following total lengths of elements illustrated in FIG. 2 are made be the same: the total length of the magnetoresistive elements S1, S2, and S3 that are connected in series between an input terminal (Vdd) and an second output terminal (V2); the total length of the magnetoresistive elements S9, S10, S11, S12, and S13 that are connected in series between the input terminal (Vdd) and a first output terminal (V1); the total length of the magnetoresistive elements S4, S5, S6, S7, and S8 that are connected in series between a ground terminal (GND) and the second output terminal (V2); and the total length of the magnetoresistive elements S14, S15, S16, S17, and S18 that are connected in series between the ground terminal (GND) and the first output terminal (V1).

As illustrated in FIG. 2, the magnetoresistive elements S are electrically connected via connecting sections 4 that are composed of a nonmagnetic conductive material. As illustrated in FIG. 2, a wiring layer 5 composed of a nonmagnetic conductive material is drawn from front end portions of the magnetoresistive elements S1 and S9, and an electrode pad 6 which constitutes the input terminal (Vdd) is formed in such a manner that the input terminal (Vdd) is formed integrally with or separately from the wiring layer 5 on the right side of an end portion of the wiring layer 5. As illustrated in FIG. 2, a wiring layer 5 composed of a nonmagnetic conductive material is drawn from end portions of the magnetoresistive elements S13 and S14, and an electrode pad 7 which constitutes the first output terminal (V1) is formed in such a manner that the first output terminal (V1) is formed integrally with or separately from the wiring layer 5 on the right side of an end portion of the wiring layer 5. As illustrated in FIG. 2, a wiring layer 5 composed of a nonmagnetic conductive material is drawn from end portions of the magnetoresistive elements S8 and S18, and an electrode pad 8 which constitutes the ground terminal (GND) is formed in such a manner that the ground terminal (GND) is formed integrally with or separately from the wiring layer 5 on the right side of an end portion of the wiring layer 5. As illustrated in FIG. 2, a wiring layer 5 composed of a nonmagnetic conductive material is drawn from back end portions of the magnetoresistive elements S3 and S4, and an electrode pad 9 which constitutes the second output terminal (V2) is formed in such a manner that the second output terminal (V2) is formed integrally with or separately from the wiring layer 5 on the right side of an end portion of the wiring layer 5.

The connecting sections 4, the wiring layers 5, the electrode pads 6 to 9 described above are composed of a nonmagnetic conductive material, such as Al, Au, or Cr.

As illustrated in FIG. 2, the magnetoresistive elements S are arranged with the connecting sections 4 interposed therebetween so as to form a meandering shape, so that each of the total lengths of the magnetoresistive elements S that are connected in series between the input terminal (Vdd) and the second output terminal (V2), between the input terminal (Vdd) and the first output terminal (V1), between the ground terminal (GND) and the second output terminal (V2), and between the ground terminal (GND) and the first output terminal (V1) illustrated in FIG. 2 is made long. This configuration increases the electric resistance value.

As illustrated in FIG. 3, an insulating layer 10 is formed from the top of the magnetoresistive elements S onto the surface of the substrate 2. A top surface 10a of the insulating layer 10 is formed so as to be a flat surface by using, for example, chemical-mechanical polishing (CMP) technology.

As illustrated in FIG. 3, the first soft magnetic bodies 3 are formed on the top surface 10a of the insulating layer 10. As illustrated in FIG. 1, each of the first soft magnetic bodies 3 is formed so as to extend a long way in the front-back direction (Y1-Y2) compared with the width dimension in the right-left direction (X1-X2). The length dimensions of the first soft magnetic bodies 3 in the front-back direction are the same. As illustrated in FIG. 1, the front (Y1) end portions of the first soft magnetic bodies 3 are magnetically connected to a second soft magnetic body 11 that is oriented in the right-left direction (Y1-Y2). The back (Y2) end portions of the first soft magnetic bodies 3 are magnetically connected to a second soft magnetic body 12 that is oriented in the right-left direction (Y1-Y2).

According to the embodiment illustrated in FIG. 1, the first soft magnetic bodies 3 and the second soft magnetic bodies 11 and 12 are integrally formed. The first soft magnetic bodies 3 and the second soft magnetic bodies 11 and 12 are composed of, for example, NiFe, CoFe, CoFeSiB or CoZrNb. The first soft magnetic bodies 3 and the second soft magnetic bodies 11 and 12 may be formed separately. In this case, the first soft magnetic bodies 3 and the second soft magnetic bodies 11 and 12 may be formed using different soft magnetic materials. In addition, the first soft magnetic bodies 3 may be spaced apart to some degree from the second soft magnetic bodies 11 and 12. In other words, the first soft magnetic bodies 3 may not be magnetically connected to the second soft magnetic bodies 11 and 12. However, it is preferable that the first soft magnetic bodies 3 and the second soft magnetic bodies 11 and 12 be integrally formed because such soft magnetic bodies have a significant magnetic shield effect on horizontal magnetic field components applied from the outside as described below and can be also formed easily.

As illustrated in FIG. 3, the first soft magnetic bodies 3 are formed in such a manner that the height dimension T2, i.e., the dimension in the height direction (Z1-Z2), is longer than the width dimension T1 in the right-left direction (X1-X2). The ratio T2/T1 is set to about 1.5 to 4.

As illustrated in FIG. 3, each of the first soft magnetic bodies 3 includes a top surface 3a which is parallel to the horizontal plane, an undersurface 3b, and side surfaces 3c which are vertical surfaces connecting the top surface 3a and the undersurface 3b. Instead of being vertical surfaces, the side surfaces 3c may be surfaces inclined downward with the width dimension T1 gradually increasing. As illustrated in FIG. 3, the magnetoresistive element S1 is disposed near a left end portion 3b1 of the undersurface 3b of the first soft magnetic body 3. The magnetoresistive elements S9 and S10 are disposed near right end portions 3b2 of the undersurfaces 3b of the first soft magnetic bodies 3.

As illustrated in FIGS. 1 and 3, a space T3 is provided in the right-left direction (X1-X2) between the first soft magnetic body 3 and each of the corresponding magnetoresistive elements S (see FIG. 3). The magnetoresistive element S and the first soft magnetic body 3 may overlap each other to some extent in plan view; however, the magnetoresistive element S and the first soft magnetic body 3 remain in a state where the magnetoresistive element S and the first soft magnetic body 3 are electrically disconnected with each other.

As illustrated in FIGS. 1 and 3, all of the magnetoresistive elements S1, S2, and S3, which are connected to one another in series between the input terminal (Vdd) and the second output terminal (V2), and the magnetoresistive elements S14, S15, S16, S17, and S18, which are connected to one another in series between the first output terminal (V1) and the ground terminal (GND), are disposed near left end portions 3b1 of the undersurfaces 3b with respect to the first soft magnetic bodies 3, whereas all of the magnetoresistive elements S4, S5, S6, S7, and S8, which are connected to one another in series between the second output terminal (V2) and the ground terminal (GND), and the magnetoresistive elements S9, S10, S11, S12, and S13, which are connected to one another in series between the input terminal (Vdd) and the first output terminal (V1), are disposed near right end portions 3b2 of the undersurfaces 3b with respect to the first soft magnetic bodies 3.

As illustrated in FIG. 3, a space T4 is provided in the height direction (Z1-Z2) between the first soft magnetic body 3 and the magnetoresistive element S.

According to the embodiment, the width dimension T1 in the right-left direction (X1-X2) of the first soft magnetic body 3 is about 3 to 10 μm, the height dimension T2 in the height direction (Z1-Z2) is about 5 to 15 μm, the space T3 is about −1 to 1 μm, and the space T4 is about 0.2 to 0.5 μm.

As illustrated in FIG. 3, vertical magnetic field components H1 are concentrated to the first soft magnetic body 3, and flow into the inside of the first soft magnetic body 3 through the top surface 3a. The vertical magnetic field components H1 pass through the inside of the first soft magnetic body 3. When the vertical magnetic field components H1 are projected outward from the end portions 3b1 and 3b2 of the undersurface 3b and from the vicinity of the undersurface end portions 3b1 and 3b2 (portions of the undersurface 3b and the side surfaces 3c that are close to the undersurface end portions 3b1 and 3b2), the vertical magnetic field components H1 are converted into magnetic field components H2 and H3 in the horizontal direction (hereinafter, may be referred to as right-direction magnetic field components H2 or left-direction magnetic field components H3). The directions of the magnetic field components H2 and H3 are parallel to the interface between the layers of the magnetoresistive element S, and a resistance value of the magnetoresistive element S varies due to the action by the magnetic field components H2 and H3.

As described using FIG. 5, the pinned magnetization direction (P direction) of the pinned magnetic layer 34 of each of the magnetoresistive elements S is the right direction (X1). Accordingly, in the magnetoresistive element S into which the right-direction magnetic field components H2 flow from a soft magnetic body 3 (the magnetoresistive elements S9 and S10 illustrated in FIG. 3), the magnetization direction of the free magnetic layer 36 is oriented in the right direction (X1), so that the magnetization directions of the pinned magnetic layer 34 and the free magnetic layer 36 become the same, causing the electric resistance value to be low. In contrast, in the magnetoresistive element S into which the left-direction magnetic field components H3 flow from a soft magnetic body 3 (the magnetoresistive element S1 illustrated in FIG. 3), the magnetization direction of the free magnetic layer 36 is oriented in the left direction (X2), so that the magnetization directions of the pinned magnetic layer 34 and the free magnetic layer 36 become antiparallel to each other, causing the electric resistance value to be high. In the bridge circuit illustrated in FIG. 4, the electric resistance values of the magnetoresistive elements S1 to S3 and S14 to S18 become high, whereas the electric resistance values of the magnetoresistive elements S4 to S8 and S9 to S13 become low. Accordingly, the potential of the first output terminal (V1) becomes higher than the midpoint potential, and the potential of the second output terminal (V2) becomes lower than the midpoint potential. By obtaining the differential output, the vertical magnetic field components H1 can be detected.

The Z-axis magnetic sensor 1 according to the embodiment includes the magnetoresistive elements S and the first soft magnetic bodies 3. This simple configuration enables the vertical magnetic field components H1 to be detected. The combination of the magnetoresistive elements S and the first soft magnetic bodies 3 is also used similarly in an X-axis magnetic sensor and a Y-axis magnetic sensor described below. When a three-axis magnetic sensor is to be formed, no members specific to the Z-axis magnetic sensor 1 are necessary. Accordingly, inexpensive magnetic sensors can be manufactured. In addition, a small-size Z-axis magnetic sensor 1 can be achieved. As illustrated in FIGS. 1 and 3, the first soft magnetic body 3 may be formed with a small width dimension T1 in the right-left direction (X1-X2), and the magnetoresistive element S may be disposed near the undersurface end portion 3b1 or 3b2 of the first soft magnetic body 3. Accordingly, the magnetoresistive elements S and the first soft magnetic bodies 3 can be disposed in such a manner that the magnetic sensor becomes compact in size, achieving a small-size Z-axis magnetic sensor 1. In addition, the Z-axis magnetic sensor 1 can be formed in a size approximately equal to those of the X-axis magnetic sensor and the Y-axis magnetic sensor.

According to the embodiment, the vertical magnetic field components H1 can be detected because the vertical magnetic field components H1 that are concentrated to the first soft magnetic body 3 pass through the inside of the first soft magnetic body 3 and are converted into magnetic field components H2 and H3 in the horizontal direction when the vertical magnetic field components H1 are projected outward from the vicinity of the undersurface end portions 3b1 and 3b2. To increase the conversion efficiency, it is necessary to increase the aspect ratio (T2/T1) of the height dimension T2 with respect to the width dimension T1 in the first soft magnetic body 3 up to about 1.5 to 4. Through this configuration, the top surface 3a and portions of the side surfaces 3c that are close to the top surface 3a of the first soft magnetic body 3 serve properly as a main concentration surface for the vertical magnetic field components H1 moving from the upward direction to the downward direction (from the Z1 direction to the Z2 direction), whereas the undersurface 3b and portions of the side surfaces 3c that are close to the undersurface 3b serve as a main projection surface for projecting the magnetic field that has passed through the inside of the first soft magnetic body 3. Upon being projected, the magnetic field spreads into the surroundings from the undersurface 3b like, for example, a bar magnet, enabling the magnetic field components in the horizontal direction to occur near the magnetoresistive elements S.

The reason why the maximum of the aspect ratio is set to 4 is that the aspect ratio of about 4 causes the conversion efficiency to be significantly excellent and that, if the aspect ratio is set to more than 4, the Z-axis magnetic sensor 1 is prevented from having a reduced height.

According to the embodiment, as illustrated in FIGS. 1 and 3, the magnetoresistive element S is disposed near the undersurface end portion 3b1 or 3b2 of the first soft magnetic body 3. FIG. 7 is a schematic diagram illustrating magnetic field strength of the first soft magnetic body 3. Since a strong magnetic field occurs near the undersurface end portions 3b 1 and 3b2, the magnetoresistive element S is disposed near the undersurface end portions 3b 1 and 3b2 so as to allow the magnetic field components H2 and H3 in the horizontal direction that have a strong magnetic field strength to act on the magnetoresistive element S. Accordingly, the sensor output can be increased, enabling the vertical magnetic field components H1 to be detected more effectively.

According to the embodiment, as illustrated in FIGS. 1 and 3, each of the magnetoresistive elements S is disposed near the undersurface end portion 3b 1 or 3b2 of the first soft magnetic body 3. All of the pinned magnetization directions (P directions) of the pinned magnetic layers 34 of the magnetoresistive elements S are oriented in the same direction. Accordingly, when the magnetoresistive elements S detect a horizontal magnetic field component H4 from the outside (see FIG. 3), all of the magnetoresistive elements S exhibit the same change in resistance, so that the output terminals V1 and V2 of the full-bridge circuit illustrated in FIG. 4 remain at the midpoint potential. In contrast, the vertical magnetic field components H1 from the outside are converted into the magnetic field components H2 and H3 in the horizontal direction by using the first soft magnetic body 3. The right-direction magnetic field components H2 flow into the magnetoresistive element S that is disposed on the right side of the first soft magnetic body 3, whereas the left-direction magnetic field components H3 flow into the magnetoresistive element S that is disposed on the left side of the first soft magnetic body 3. Consequently, the magnetoresistive element S that is disposed on the right side of the first soft magnetic body 3, and the magnetoresistive element S that is disposed on the left side exhibit different changes in resistance. By configuring the bridge circuit illustrated in FIG. 4 by using the magnetoresistive elements S1 to S18, the Z-axis magnetic sensor 1 can be configured in which the detection of the horizontal magnetic field component H4 can be suppressed, and in which the vertical magnetic field components H1 can be properly detected.

As described above, according to the embodiment, since the pinned magnetization directions (P directions) of the pinned magnetic layers 34 of all of the magnetoresistive elements S may be oriented in the same direction, all of the magnetoresistive elements S can be formed on the same substrate 2, allowing the Z-axis magnetic sensor 1 to be easily manufactured.

As illustrated in FIGS. 1 and 2, the magnetoresistive elements S1 to S18 and the first soft magnetic bodies 3 extend a long way in the front-back direction (Y1-Y2); however, the magnetoresistive elements S1 to S18 are formed so as to be shorter than the first soft magnetic bodies 3. Accordingly, when the magnetoresistive elements S are disposed on both right and left sides of the first soft magnetic body 3, the magnetoresistive elements S may be disposed opposite to each other in the right-left direction (X1-X2) like the magnetoresistive elements S1 and S9. Instead, like the magnetoresistive elements S10, S2, and S5, the magnetoresistive elements S may be disposed by shifting each other in the front-back direction (so as not to be opposite to each other in the right-left direction). Thus, a range of choices for an arrangement of the magnetoresistive elements S is wide.

As illustrated in FIG. 1, the multiple first soft magnetic bodies 3 are arranged with a space therebetween in the right-left direction (X1-X2). As in plan view in FIG. 1, the magnetoresistive element S located between the first soft magnetic bodies 3 is formed so as to be located closer to either of the first soft magnetic bodies 3 with respect to the center of the space in the right-left direction (X1-X2). For example, the magnetoresistive element S9 is located closer to the first soft magnetic body 3 that is located on the left side of the magnetoresistive element S9 as illustrated in FIGS. 1 and 3.

As illustrated in FIG. 3, a space T5 is provided between the first soft magnetic bodies 3, and is about 10 to 25 µm particularly. A space T6 between the magnetoresistive element S9 and the first soft magnetic body 3 that is located on the right side of and far from the magnetoresistive element S9 is about 7 to 22 µm.

Thus, the right-direction magnetic field components H2 (first conversion magnetic field components) from the first soft magnetic body 3 on the left side of the magnetoresistive element S9 flow into the magnetoresistive element S9 illustrated in FIG. 3. In contrast, since the first soft magnetic body 3 on the right side of the magnetoresistive element S9 is far from the magnetoresistive element S9, the left-direction magnetic field components H3 (second conversion magnetic field components) from the first soft magnetic body 3 on the right side do not flow into the magnetoresistive element S9 or, even when the left-direction magnetic field components H3 flow in, the amount of the left-direction magnetic field components H3 is small. The situation in which the right-direction magnetic field components H2 supplied to the magnetoresistive element S9 are canceled or extremely reduced due to the left-direction magnetic field components H3 can be suppressed, allowing the vertical magnetic field components H1 to be detected properly.

The first soft magnetic bodies 3 which extend a long way in the front-back direction (Y1-Y2) absorb a horizontal magnetic field component H5 illustrated in FIG. 1 which flows in the front-back direction (Y1-Y2) from the outside, allowing the horizontal magnetic field component H5 to rarely flow into the magnetoresistive elements S.

According to the embodiment, the second soft magnetic bodies 11 and 12 which extend in the right-left direction (X1-X2) are provided in end portions on both sides of the first soft magnetic bodies 3 in the front-back direction (Y1-Y2). Accordingly, the second soft magnetic bodies 11 and 12 can absorb a horizontal magnetic field component H6 illustrated in FIG. 1 which flows in the right-left direction (X1-X2) from the outside, allowing the horizontal magnetic field component H6 to rarely flow into the magnetoresistive elements S.

Thus, the first soft magnetic bodies 3 or the second soft magnetic bodies 11 and 12 can properly absorb the horizontal magnetic field components H5 and H6 which flow in the front-back direction (Y1-Y2) and the right-left direction (X1-X2), allowing the influence of the horizontal magnetic field components from the outside on the magnetoresistive elements S to be more effectively reduced. Therefore, the sensitivity of the magnetoresistive elements S to the horizontal magnetic field components H5 and H6 can appear to be more effectively reduced. Consequently, the sensitivity to the vertical magnetic field components H1 can be relatively improved, allowing the vertical magnetic field components H1 to be detected more effectively. Even when all of the horizontal magnetic field components H5 and H6 are not absorbed by the second soft magnetic bodies 11 and 12 and some of the horizontal magnetic field components H5 and H6 flow into the magnetoresistive elements S, as described above using the horizontal magnetic field component H4 in FIG. 3, the magnetoresistive elements S may exhibit the same change in electric resistance, allowing the appearance of the output caused by the horizontal magnetic field components H5 and H6 to be suppressed. Thus, with the configuration according to the embodiment which includes the magnetoresistive elements S, the first soft magnetic bodies 3, and the second soft magnetic bodies 11 and 12, a Z-axis magnetic sensor 1 can be configured in which only the vertical magnetic field components H1 can be more effectively and properly detected without detecting the horizontal magnetic field components H5 and H6.

FIG. 11 is a graph showing relationship between an applied magnetic field and outputs which is obtained when a Z-axis magnetic sensor according to the embodiment is used. In this experiment, the structure of the Z-axis magnetic sensor 1 illustrated in FIG. 1 was used. It was found that, as illustrated in FIG. 11, when horizontal magnetic fields in the X1-X2 direction and the Y1-Y2 direction act, the output is significantly low, whereas when a vertical magnetic field (magnetic field components in the Z direction) acts, the change in the output is large. Thus, it was found that the Z-axis magnetic sensor 1 according to the embodiment enables the output for the horizontal magnetic field components to be made extremely small and enables only the vertical magnetic field components to be properly detected.

FIG. 10A is a partial plan view of a Y-axis magnetic sensor 50. FIG. 10B is a partial vertical sectional view of the Y-axis magnetic sensor 50, taken along line XB-XB in the height direction and viewed in the direction of the arrows.

As illustrated in FIG. 10A, element sections 14 and intermediate permanent magnet layers 60, which are formed by employing the same multilayer structure as in FIG. 5, are formed alternately in the right-left direction (X1-X2). On the outer sides of the element sections 14 that are located on the most outer sides in the right-left direction among all of the element sections 14, outside permanent magnet layers 65 are disposed. The element sections 14, the intermediate permanent magnet layers 60, and the outside permanent magnet layers 65 constitute an element tandem 61 which extends like a strip.

As illustrated in FIG. 10A, multiple element tandems 61 are arranged parallel to each other with a space in the front-back direction (Y1-Y2). Connecting sections 62 connect the outside permanent magnet layers 65 to each other which are disposed in end portions of the element tandems 61 so that a meander-shaped magnetoresistive element S is formed.

According to the embodiment, bias magnetic field components in the right-left direction (X1-X2) act on the element sections 14 from the permanent magnet layers 60 and 65. Accordingly, the magnetization direction of the free magnetic layers 36 included in the element sections 14 is oriented in the X1-X2 direction when no magnetic fields are present. In contrast, the pinned magnetization direction (P direction) of the pinned magnetic layers 34 is oriented in the Y1-Y2 direction.

As illustrated in FIG. 10B, the magnetoresistive element S is formed through an insulating layer (not illustrated) on a substrate 16. An insulating layer 17 composed of, for example, Al2O3 or SiO2 overlies the magnetoresistive element S.

As illustrated in FIGS. 10A and 10B, soft magnetic bodies 18 are disposed between the element tandems 61 included in the magnetoresistive element S, and disposed on the outer sides of the element tandems 61 that are located on the most outer sides among all of the element tandems 61. The soft magnetic bodies 18 are disposed so as to be electrically disconnected with the element tandems 61. The soft magnetic bodies 18 are formed in the form of thin films by, for example, sputtering or plating. The soft magnetic bodies 18 are composed of, for example, NiFe, CoFe, CoFeSiB, or CoZrNb, and are preferably composed of CoZrNb.

As illustrated in FIG. 10B, a width dimension T7 of each of the soft magnetic bodies 18 in the front-back direction (Y1-Y2) is about 3 to 10 μm, and a height dimension T8 of the soft magnetic body 18 is about 0.5 to 1.5 μm. The ratio T8/T7 is set to about 0.05 to 0.5. Thus, the height dimension T8 of the soft magnetic body 18 used in the Y-axis magnetic sensor 50 is smaller than the height dimension T2 of the first soft magnetic body 3 used in the Z-axis magnetic sensor 1, and the aspect ratio (T8/T7) with respect to the width dimension T7 is also smaller than that of the first soft magnetic body 3. Consequently, if the vertical magnetic field components H1 act on the Y-axis magnetic sensor 50, the Y-axis magnetic sensor 50 has a small capability of converting the vertical magnetic field components H1 into the magnetic field components H2 and H3 in the horizontal direction as illustrated in FIG. 3, so that the Y-axis magnetic sensor 50 fails to detect the vertical magnetic field components H1. In contrast, when the horizontal magnetic field component H5 in the front-back direction (Y1-Y2) acts on the Y-axis magnetic sensor 50, the electric resistance value of the free magnetic layer 36 of each of the element sections 14 changes, so that the Y-axis magnetic sensor 50 is capable of detecting the horizontal magnetic field component H5 in the front-back direction (Y1-Y2). Since the horizontal magnetic field component H6 in the right-left direction (X1-X2) is absorbed by the soft magnetic bodies 18 which serve as magnetic shield, the element sections 14 appear to have decreased sensitivity to the horizontal magnetic field component H6 in the right-left direction (X1-X2), and do not detect the horizontal magnetic field component H6 in the right-left direction (X1-X2). Thus, the Y-axis magnetic sensor 50 detects the horizontal magnetic field component H5 in the front-back direction (Y1-Y2).

An X-axis magnetic sensor (not illustrated) has a configuration obtained by rotating the Y-axis magnetic sensor 50 in FIG. 10A 90° on the X-Y plane, and detects the horizontal magnetic field component H6 in the right-left direction (X1-X2).

As illustrated in FIGS. 6A and 6B, according to the embodiment, an X-axis magnetic sensor 70, the Y-axis magnetic sensor 50, and the Z-axis magnetic sensor 1 may be disposed on a base 71. As illustrated in FIGS. 6A and 6B, the pinned magnetization direction (P direction) of the pinned magnetic layer 34 of the magnetoresistive element S included in the X-axis magnetic sensor 70 is the X1-X2 direction, and that in the Y-axis magnetic sensor 50 is the Y1-Y2 direction. The pinned magnetization direction (P direction) of the pinned magnetic layer 34 of the magnetoresistive element S included in the Z-axis magnetic sensor 1 may be the Y1-Y2 direction as illustrated in FIG. 6A, or may be the X1-X2 direction. Instead, the pinned magnetization direction (P direction) may be set to the diagonal direction by forming the magnetoresistive element S diagonally between the Y1-Y2 direction and the X1-X2 direction as illustrated in FIG. 6B.

As illustrated in FIG. 8, in the Z-axis magnetic sensor 1, the magnetoresistive elements S and the first soft magnetic body 3 may be formed on the same surface of the substrate 2. The X-axis magnetic sensor 70 and the Y-axis magnetic sensor 50 may have a similar configuration. Instead, a portion of the top surface 10a of the insulating layer 10 illustrated in FIG. 3 is made recessed, and the first soft magnetic body 3 may be formed on the recessed portion. This configuration allows the undersurface 3b of the first soft magnetic body 3 to be located at a position lower than the undersurface 3b in FIG. 3.

As illustrated in FIG. 9, another configuration may be employed in which, unlike FIG. 1, the second soft magnetic bodies 11 and 12 are not provided and in which the space between the first soft magnetic bodies 3 is open in the front-back direction (Y1-Y2).

What is claimed is:

1. A magnetic sensor comprising:
   a plurality of magnetoresistive elements each having a plurality of layers including a magnetic layer and a nonmagnetic layer formed on a substrate defining an X-Y plane, the plurality of magnetoresistive elements having a magnetoresistance effect; and
   a plurality of soft magnetic bodies electrically disconnected from the plurality of magnetoresistive elements, the plurality of soft magnetic bodies including:
      a plurality of first soft magnetic bodies each converting a vertical Z-direction component of an external magnetic field into a horizontal direction parallel to the X-Y plane so as to provide the plurality of magnetoresistive elements with the horizontally converted magnetic field component, the plurality of first soft magnetic bodies extending in a Y-direction of the X-Y plane and separated from each other in an X-direction of the X-Y plane with a space provided therebetween; and
      a pair of second soft magnetic bodies extending in the X-direction and provided on both sides of the plurality of first soft magnetic bodies in the Y-direction, one end of each of the plurality of first soft magnetic bodies being directly connected to one of the pair of second soft magnetic bodies and another end of each of the plurality of first soft magnetic bodies being directly connected to another of the pair of second soft magnetic bodies such that the first and second soft magnetic bodies are integrally formed, the second soft magnetic bodies guiding a horizontal component of the external magnetic field in the X-direction,
   wherein each of the plurality of magnetoresistive elements extends in the Y-direction and is provided along one side of one of the plurality of first soft magnetic bodies, the plurality of magnetoresistive elements include at least one first magnetoresistive element disposed, viewed from the Z-direction, in the space between adjacent two first soft magnetic bodies among the plurality of first soft magnetic bodies, the adjacent two first soft magnetic bodies being directly other, the at least one first magnetoresistive element being closer in the X-direction to one of the adjacent two first soft magnetic bodies than to the other of the adjacent two first soft magnetic bodies, such that the one of the adjacent two first soft magnetic bodies is accompanied by the at least one first magnetoresistive element extending along one side thereof, the plurality of magnetoresisive elements including at least one second magnetoresistive element extending along another side of the one of the adjacent two first soft magnetic bodies, the at least one first and second magnetoresistive elements being closer to the one of the adjacent two first soft magnetic bodies in the X-direction than to any other of the plurality of first soft magnetic bodies viewed from the Z-direction.

2. The magnetic sensor according to claim 1,
   wherein the at least one first magnetoresistive element is disposed along a first edge portion clan undersurface of the one of the adjacent two first soft magnetic bodies and lower than the undersurface.

3. The magnetic sensor according to claim 2,
   wherein the at least one second magnetoresistive element is disposed along a second edge portion of the undersurface of the one of the adjacent two first soft magnetic bodies and lower than the undersurface, the first and second edge portions being located on opposing sides of the undersurface.

4. The magnetic sensor according to claim 3,
   wherein each of the plurality of magnetoresistive elements is shorter than the plurality of first soft magnetic bodies in the Y-direction.

5. The magnetic sensor according to claim 1, further comprising:
   an insulating layer formed over the plurality of magnetoresistive elements and the substrate, wherein the plurality of soft magnetic bodies are formed on the insulating layer.

6. The magnetic sensor according to claim 1, wherein each of the first soft magnetic bodies includes:
   a main concentration surface including a top surface of a respective one of the first soft magnetic bodies that concentrates the vertical component of the external magnetic field; and
   a main projection surface including a undersurface of respective one of the first soft magnetic bodies that releases the external magnetic field having passed through the respective one of the first soft magnetic bodies as one of the horizontally converted magnetic field components,
   and wherein each of the first soft magnetic bodies has an aspect ratio of 1.5 to 4, the aspect ratio being a ratio of a height to a width thereof, the height being a distance between the top surface and the undersurface of the respective one of the first soft magnetic bodies.

* * * * *